United States Patent
Schug et al.

(10) Patent No.: US 7,670,038 B2
(45) Date of Patent: Mar. 2, 2010

(54) LED COLLIMATOR ELEMENT WITH AN ASYMMETRICAL COLLIMATOR

(75) Inventors: Josef Andreas Schug, Wurselen (DE); Egbert Lenderink, Waalre (NL); Joseph Sormani, Knegsel (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 332 days.

(21) Appl. No.: 11/575,332

(22) PCT Filed: Sep. 12, 2005

(86) PCT No.: PCT/IB2005/052978

§ 371 (c)(1), (2), (4) Date: Mar. 15, 2007

(87) PCT Pub. No.: WO2006/033042

PCT Pub. Date: Mar. 30, 2006

(65) Prior Publication Data

US 2008/0316760 A1 Dec. 25, 2008

(30) Foreign Application Priority Data

Sep. 20, 2004 (EP) .................................. 04104538

(51) Int. Cl.
*B60Q 1/321* (2006.01)
(52) U.S. Cl. ....................... 362/507; 362/514; 362/241; 362/296; 362/341; 362/346
(58) Field of Classification Search .................. 362/507, 362/514, 516, 517, 518, 241, 341, 346, 349, 362/296–302, 343
See application file for complete search history.

(56) References Cited

U.S. PATENT DOCUMENTS

| 5,136,483 | A | * | 8/1992 | Schoniger et al. ........... 362/545 |
| 5,762,414 | A | | 6/1998 | Montalan et al. |
| 6,481,130 | B1 | | 11/2002 | Wu |
| 6,502,956 | B1 | | 1/2003 | Wu |
| 7,073,931 | B2 | * | 7/2006 | Ishida ........................ 362/539 |
| 2003/0198060 | A1 | | 10/2003 | Ishida et al. |
| 2003/0214815 | A1 | | 11/2003 | Ishida et al. |
| 2004/0042212 | A1 | | 3/2004 | Du et al. |
| 2004/0076016 | A1 | | 4/2004 | Sato et al. |

FOREIGN PATENT DOCUMENTS

| DE | 2800797 | 7/1978 |
| DE | 8909067 | 11/1989 |
| DE | 10006804 | 8/2001 |
| DE | 20116022 | 1/2002 |
| DE | 10037005 | 2/2002 |

(Continued)

*Primary Examiner*—Jong-Suk (James) Lee
*Assistant Examiner*—Mark Tsidulko

(57) ABSTRACT

The invention relates to an LED collimator element (1; 20) which can be used in particular for motor vehicle headlights. It comprises an LED (2; 23), of which the emitted light can be emitted essentially directly into an emission angle region of the LED collimator element (1; 20), and a collimator (3; 22) which deflects the light which is not emitted in the emission direction into the emission angle region. The LED collimator element (1; 20) is designed to be asymmetrical at least with respect to a sectional plane (4) so that a defined non-uniform light intensity distribution is achieved in an emission plane (10; 26) of the LED collimator element (1; 20) which is orthogonal to the sectional plane (4) and to the main emission direction.

20 Claims, 5 Drawing Sheets

FOREIGN PATENT DOCUMENTS

| | | |
|---|---|---|
| DE | 10140692 | 3/2003 |
| EP | 1011151 A2 | 6/2000 |
| EP | 1371901 A2 | 12/2003 |
| JP | 61113290 | 5/1986 |
| JP | 8204239 | 8/1996 |
| JP | 2001332104 | 5/2000 |
| JP | 2002157904 | 5/2002 |
| WO | 9745674 | 12/1997 |

* cited by examiner

LED COLLIMATOR ELEMENT WITH AN ASYMMETRICAL COLLIMATOR

The invention relates to an LED collimator element, in particular for use as a motor vehicle headlight, for generating light radiation which is distributed in a targeted and non-uniform manner.

The development of LED elements means that, in the near future, LED elements will be available which have sufficient brightness to be used for example as front headlights of motor vehicles. With vehicle headlights, there are generally produced firstly a so-called main beam and secondly a low beam. The main beam provides a maximum possible illumination of the traffic space. The low beam, on the other hand, provides a compromise between as good an illumination as possible from the perspective of the vehicle driver and as little dazzling of oncoming vehicles as possible. In order that the oncoming traffic is not dazzled under normal conditions on a straight road, a lighting pattern is prescribed for the low beam in which no light is emitted in an emission plane of the headlight above a horizontal line, that is to say the headlight must form a sharp cut-off. However, since the headlight with the region directly below the cut-off is to illuminate that traffic space which has the greatest distance from the vehicle, on the other hand the greatest intensity of the headlight must be provided directly at the cut-off.

Particularly for use as motor vehicle headlights, therefore, two essential properties of a lighting device are required: firstly, the light source must be able to illuminate with a high intensity a space at a distance of approximately 75 m from the light source, and secondly it must form a sharp cut-off between the well-illuminated space and the non-illuminated area lying behind it, that is to say it must be able to produce a light radiation which is distributed in a defined and non-uniform manner. Towards the area of the road lying closer to the vehicle, light is to be emitted with a lower intensity. On account of the shorter distance from the headlight, too high a light intensity would otherwise be produced there. A sufficient intensity in the well-illuminated area is directly related to the brightness (luminance) of the light source and the performance of the optics which cooperate therewith. The production of light radiation which is distributed in a defined and non-uniform manner, in particular the formation of a sharp cut-off, is by contrast a design requirement.

In the halogen and xenon lamp systems used to date, a sharp cut-off is usually achieved by screens being used. Together with reflectors and projection lenses, a sharp cut-off can thus be achieved. Although the use of screens entails a loss of light, since it is absorbed or reflected at the screen, this is not a problem at least in xenon lamp systems since they produce sufficient light current. More recently, it is also possible to use reflectors of complex shape which project the light produced by the light source into the traffic space in a suitable manner.

In lamp systems using LEDs, attempts are being made to overcome the problem of intensity, including by using a number of LEDs and by superposing their lighting image. Such an arrangement is known from US 2003/019806 A1. According to said document, a number of LEDs are arranged next to one another, as is readily possible on account of their low space requirement, and this leads to new designs of motor vehicle headlights. Arranged above each individual LED is a reflector which deflects the light emitted by the LED essentially at right angles into an emission direction. Together with a light-guiding edge, which is arranged behind the LED in the emission direction, the reflector produces a lighting image with a sharp cut-off which is superposed with the other lighting images by means of a projection lens and projected into the traffic space. One disadvantage of this design is that almost all of the radiation emitted by the LED is reflected at least once before passing into the secondary optics. However, each reflection also means a certain loss of light power, as a result of which the power of this lighting system is reduced.

It is therefore an object of the present invention to further develop a lighting system of the type mentioned above, in such a manner that the unavoidable losses associated therewith are minimized.

In order to achieve this object, there is proposed an LED collimator element which comprises an LED, of which the light emitted during operation is emitted essentially directly into an emission angle region of the LED collimator element, and a collimator which deflects the light of the LED which is not emitted into the emission angle region into the emission angle region. The LED collimator element is designed to be asymmetrical at least with respect to a collimator sectional plane so that a defined non-uniform light intensity distribution is achieved in an emission plane of the LED collimator element which is orthogonal to the collimator sectional plane and to a main emission direction of the LED collimator element.

The emission angle region is the angle region in which the light is emitted from the collimator in order to produce the desired targeted illumination. The relevant emission angle region is essentially the interception region of the secondary optics. The main emission direction of the LED collimator element is to be understood as being the emission direction within the emission angle region in which the greatest amount of light is emitted. The collimator sectional plane lies in the main emission direction of the LED collimator element and also intersects the LED element. The emission plane runs essentially orthogonal to the collimator sectional plane through the LED collimator element and usually lies parallel to a light entry plane of secondary optics. It is a geometrical space which usually coincides with an opening face of the collimator. The term "collimator" is to be understood as meaning a reflective face which essentially intercepts all the light of the LED element which is not emitted directly into the emission angle region. Unlike a reflector, the collimator is located directly adjacent to the LED chip. In order to take account of tolerances during the manufacture of the LED chip, the collimator may have a small distance from the LED, which may be for example approximately 0.5 mm or even preferably less. In other words, a distance of the collimator from the LED, for example the distance of the edge of the collimator adjacent to the LED from the LED, should preferably be less than or equal to approx. 0.5 mm, preferably even less than or equal to approx. 0.25 mm. This also supports a further aim of the invention, namely a design that is as miniaturized as possible. The term "non-uniform light intensity distribution" is to be understood as meaning a light intensity distribution in the emission plane in which different brightnesses exist in different regions.

The invention thus moves away from the principle used in the abovementioned prior art of deflecting most of the light emitted by the LED element into the emission angle region of the collimator, and instead follows the principle of essentially making direct use of the light emitted by the LED element and for example introducing it directly into secondary optics. This is derived from the knowledge that each deflection which has to be brought about by means of reflection leads to losses in terms of lumen output.

Hereinbelow, it is assumed that the LED elements are inorganic solid state LEDs since these are currently available with sufficient intensity. Nevertheless, they may of course also be other electroluminescent elements, for example laser diodes, other light-emitting semiconductor elements or organic LEDs, provided these have sufficient power. The term "LED" or "LED element" is therefore to be regarded in this document as a synonym for any type of appropriate electroluminescent element. One constituent of the LED element may also be a luminous substance in the form of a powder or a crystal, which converts some or all of the light produced into light of a different wavelength.

As mentioned above, particularly for applications in vehicle headlights, a sharp cut-off is required below which the intensity is as high as possible. One advantageous embodiment of the invention therefore provides that the non-uniform light intensity distribution is configured in such a way that a high intensity is present directly at a first edge of the collimator and that essentially no light intensity is present on the side of this edge of the collimator which faces away from the LED, in order that a sharp cut-off is produced without a considerable amount of the radiation being screened out by means of screens or the like. With regard to the lumen output, the design thus operates virtually without any losses.

A non-uniform light intensity distribution in the emission plane of a lighting device is moreover desirable when objects at varying distance from the emission plane are to be illuminated with an almost identical light intensity. According to another advantageous embodiment of the invention, therefore, the intensity in the emission plane decreases as the distance from the first edge of the collimator increases and thus as the distance from an opposite second edge of the collimator decreases. Starting from the first edge of the collimator, the intensity therefore has a defined gradient. This continuous transition from a strong light intensity along the first edge of the collimator to a weaker intensity towards an opposite edge of the collimator is required whenever a target surface which is inclined with respect to the emission plane is to be illuminated in as uniform a manner as possible. This is the case not just in motor vehicle headlights which are to illuminate a given traffic space in front of the motor vehicle, but also in other applications, for example when illuminating in as uniform a manner as possible wall surfaces by means of lighting elements which are attached to a ceiling located thereabove.

According to the invention, the non-uniform light intensity distribution is achieved in that the LED collimator element is designed in an asymmetrical manner.

This may on the one hand be achieved in that the LED is arranged in a tilted manner with respect to the sectional plane of a symmetrical collimator. In this embodiment, the asymmetry is not obtained by the design of the collimator. Rather, it results from the arrangement of the LED element, the main emission direction of which does not coincide with the axis of symmetry or sectional plane of the collimator but rather encloses an angle therewith. In this way, a non-uniform light intensity distribution is achieved in a simple manner because then one face of the collimator is irradiated to a greater extent, as a result of which greater reflection of radiation takes place on this face than on the face lying opposite it.

An alternative form of an asymmetrical configuration of an LED collimator element consists in that opposing faces of the collimator are designed differently. This may be understood to mean on the one hand that the reflective faces of the collimator are shaped differently, but on the other hand also that the reflective faces of the collimator are configured differently, namely for example that opposing collimator faces have non-identical reflection characteristics. In one extreme case, one face of the collimator may be designed to be highly reflective whereas the other face—which is nevertheless struck by smaller amounts of the light emitted by the LED—has absorbing properties. Since the absorbing face of the collimator thus does not help to transmit the light of the LED collimator element, this face can be fully or partially omitted, and the light emitted by the LED in this direction can be absorbed by adjoining components.

Particularly preferably, the asymmetrical configuration of the LED collimator element may consist in that the face of the collimator on which the first edge is formed is less inclined than the second face with respect to the main emission direction, so that the collimator produces a sharp cut-off as described above. In one simple case, the first and second edges of the collimator are located on opposite faces of the collimator, so that the light emitted by the LED element is emitted in a more highly bundled manner at the first edge than at the second edge.

In one particularly advantageous embodiment of the invention, the first face is not inclined or has only a slight inclination of a few degrees with respect to the main emission direction. This means that light which does not leave the collimator in a direct line without any reflection is emitted, after one or more reflections, at or in the vicinity of the first edge of the collimator, so that a high light intensity forms there.

In one combined variant of the abovementioned design alternatives, an LED which is arranged in a tilted manner with respect to the collimator sectional plane is arranged in an asymmetrical collimator.

All of these designs therefore strive to make the boundaries of the emission angle region coincide with the reflector face on which the first edge is formed.

According to another advantageous embodiment of the invention, secondary optics are arranged behind the collimator opening in the main emission direction, which secondary optics project the emitted light into the space which is to be illuminated. The secondary optics may usually consist of a projection lens which projects the lighting image produced by the LED collimator element onto the object which is to be illuminated.

The secondary optics may also comprise a semiparabolic reflector into which the light from the LED collimator element is irradiated. The semiparabolic reflector has a focal point in a light entry plane—in the case of a three-dimensional curvature of the reflector. Light rays directed in different directions which are irradiated onto the focal point are uniformly emitted parallel to an emission direction of the reflector, independently of the direction in which they were introduced into the reflector. Light radiation which is introduced outside the focal point is emitted at an angle with respect to the emission direction. That radiation which strikes the irradiated plane behind the focal point in the emission direction is emitted in a first direction at an angle with respect to the emission direction. On the other hand, light radiation which is coupled into the irradiated plane in front of the focal point in the emission direction, that is to say between the focal point and a first edge of the reflector, leaves the reflector with an inclination opposed to the first direction with respect to the emission direction.

Preferably, use is made of a semiparabolic reflector which is curved only in one direction, that is to say in a two-dimensional manner. The two-dimensionally curved semiparabolic reflector has, in a sectional view parallel to the emission direction of the reflector, in principle the same geometric design as a three-dimensionally curved reflector. However, since it has the same design in an unmodified manner in a direction orthogonal to the sectional plane, a focal line is produced from placing a number of focal points of each sectional view in a row next to one another. However, seen in a sectional plane, the focal line has the same geometric significance as the focal point of a three-dimensionally curved reflector, and for this reason no distinction will be made between focal point and focal line in the text which follows.

The LED collimator element is preferably arranged in such a way that it moreover irradiates the light either completely in front of or completely behind the focal point, including the focal point. In one particularly preferred embodiment of the invention, the LED collimator element is arranged with its first edge in the region of the focal point, so that it irradiates the light highly bundled at the first edge onto the focal point of the semiparabolic reflector. The formation of a sharp cut-off is thus assisted in design terms in two ways, namely on the one hand, as described above, by the asymmetrical design of the LED collimator element. On the other hand, the semiparabolic mirror also serves this purpose: by irradiating light between the focal point and the first edge of the semiparabolic reflector, it is ensured that the light is emitted from the semiparabolic reflector only in a region which is sharply delimited on one side by the emission direction of the semiparabolic reflector. The invention consequently makes use of the two effects mentioned above in order to produce a sharp cut-off.

By combining the asymmetrical collimator with a semiparabolic reflector, undesirable scattered light of the asymmetrical collimator, which would dilute the sharp cut-off, is moreover eliminated. This is because the fact of irradiating the light into the parabolic reflector between the focal point and the first edge of the semiparabolic reflector means that the light, regardless of which direction it was introduced into the parabolic reflector, in any case cannot be emitted in the undesirable region on the other side of the emission direction of the semiparabolic reflector. By combining asymmetrical LED collimator element and semiparabolic reflector, consequently there is achieved on the one hand a sharp cut-off and on the other hand a high light intensity along the sharp cut-off.

In addition, a projection lens may be arranged downstream of the semiparabolic reflector in the emission direction of the latter, which projection lens irradiates the light emitted by the reflector into the traffic space.

Another advantageous embodiment of the invention consists in that a number of LEDs are arranged in a collimator, preferably parallel to the collimator sectional plane, with respect to which the LED collimator element is designed in an asymmetrical manner. The lighting image of each individual LED element can in this case be superposed with that of the others or combined with them in the manner of a mosaic, so that either a higher light intensity or a larger illuminated space can be produced.

LED collimator elements according to the invention can be produced in a cost-effective manner for example by installing conventional LEDs in collimators which are designed in an asymmetrical manner in accordance with the above-described features and/or which have a seat for an LED in order to accommodate the LED(s) in an inclined manner with respect to a main emission direction of the collimator.

Preferably, a number of LED elements with different characteristics, e.g. different lumen output or different colors, can be combined in a collimator. During simultaneous operation, the mixing of light in the collimator gives rise to an averaged result. When producing LEDs, there is usually a scattering of the aforementioned parameters about the desired values. Combining a number of LED elements in a collimator with for example too high and too low a color temperature nevertheless makes it possible to produce light of the desired color and thus allows more economic use of the entire manufacturing scope. Combining LEDs with different color properties moreover makes it possible, by virtue of non-uniform control of the respective elements, to change in a defined manner the color of the light produced by the collimator.

The invention will be further described with reference to examples of embodiments shown in the drawings to which, however, the invention is not restricted.

Figure 1:
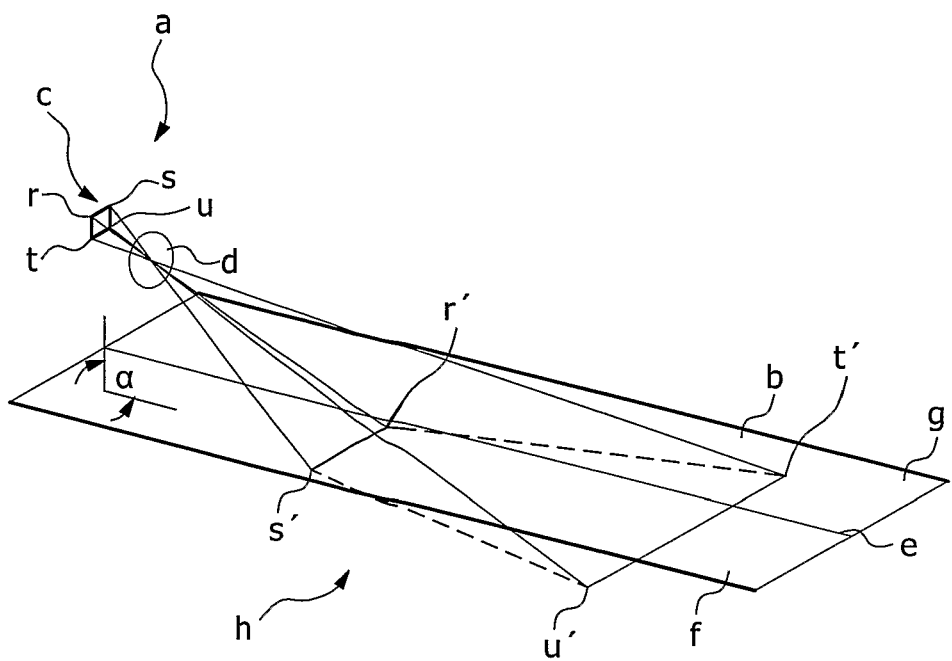
FIG. 1 shows a simplified perspective diagram of the ray courses of a headlight on a road.

FIG. 1 schematically shows the radiation course of the light of a headlight a on a road b. The headlight a is symbolized by an emission face c of an LED collimator element and by secondary optics d. The emission face c has four boundary lines between the corners r, s, t and u. The road b is divided into two lanes f and g by a center line e. The vehicle (not shown) which has the headlight a is located in the lane f. The lane g is used for oncoming traffic. The headlight a illuminates a traffic space h and produces an image there which has the corners r', s', t' and u'.

The light coming from the emission face c strikes the secondary optics d. The latter is usually formed by a lens which projects the emission face back to front and upside down. Since the emission plane c is at an angle α with respect to the lane f which is to be illuminated, the image thereof which is produced on the lane is distorted. Despite the same length of the dimension from r to s and from t to u, the dimension from t' to u' is a multiple length of the dimension from r' to s'. This distortion also has to be taken into account when illuminating the traffic space h. It means that, given a more or less uniform illumination of the traffic space h, much more light power is required at the edge of the emission plane between u and t than at the opposite edge between r and s. Ideally, therefore, a continuous transition or a light intensity gradient is formed between a high light power at the edge u and t towards a lower light power at the edge r and s.

In order to avoid dazzling the oncoming traffic, no light is to be emitted outside the image having the corners r', s', t' and u'. This relates in particular to the edge between t' and u'. Here, the light source must form a sharp cut-off because light above this edge would dazzle the oncoming traffic. The cut-off must accordingly be formed at the emission plane along the line from t to u.

Figure 2:
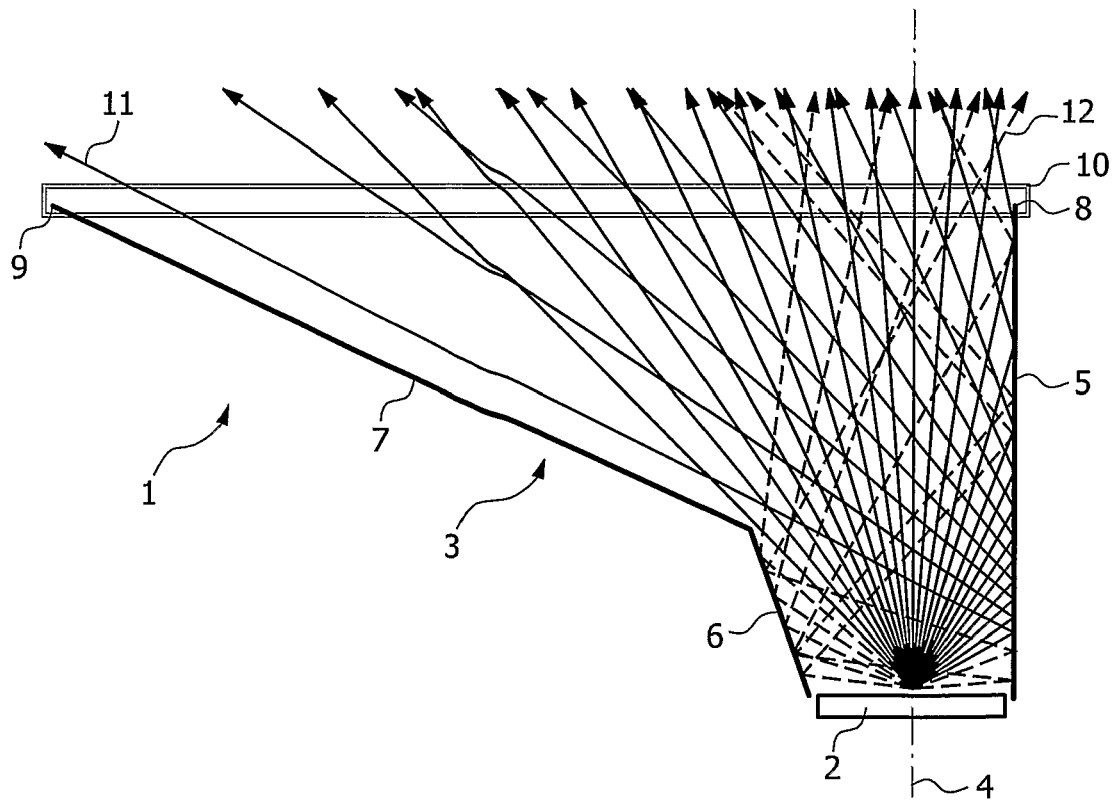
FIG. 2 shows a section through an LED collimator element according to the invention, according to a first example of embodiment.

In the design of an LED collimator element according to the invention, these requirements are achieved as follows:

An LED collimator element 1 as shown in FIG. 2 comprises an LED element 2 and a collimator 3. The LED element 2 emits light in a main emission direction which runs parallel to a first collimator sectional plane 4. The main emission direction of the LED element 2 is defined here as vertical with respect to the plane in which the chip of the LED element 2 extends.

The collimator 3 comprises a first reflector face 5 which runs parallel to the first collimator sectional plane 4. Opposite the first reflector face 5 with respect to the first collimator sectional plane 4, there is a second reflector face which is composed of a lower section 6 and an upper section 7. In order to prevent losses, the distances of the two reflector faces from the LED element are small and are considerably smaller than the size of said element. Both sections 6, 7 have in the main emission direction an inclination away from the collimator sectional plane 4. The lower section 6 is much less inclined than the upper section 7 with respect to the collimator sectional plane 4. The first reflector face 5 and the upper section 7 open into an emission face 10 at a first edge 8 of the collimator and at a second edge 9 of the collimator which lies opposite the first edge. The emission face 10 is to be understood merely as a geometric location which coincides with the collimator opening in FIG. 1. Both the main emission direction of the LED element 2 and the collimator sectional plane 4 are perpendicular to the emission face 10.

FIG. 2 shows the mode of operation of the asymmetrical collimator 3 in cooperation with an LED element 2. One ray bundle which is emitted from the LED element 2 is shown by way of example in FIG. 2. However, in actual fact, the LED element 2 emits light over its entire width in a non-directional manner (Lambert's radiation). The radiation of the LED element 2 is symbolized by unbroken arrows 11 and dashed arrows 12. The unbroken arrows 11 represent that radiation which is emitted either directly or at most reflected once on the first reflector face 5. Because the first reflector face 5 runs parallel to the collimator section plane 4 in a direction away from the LED chip 2, it reflects a relatively large amount of the emitted light into a space which in this case lies opposite the collimator sectional plane 4, that is to say in the direction of the second edge 9.

The lower section 6 runs from an edge of the LED element 2 with an inclination away from the collimator sectional plane 4. It thus reflects a considerable amount of that light which is emitted at a large angle with respect to the main emission direction or the collimator sectional plane 4. On account of its inclination, however, the lower section 6 reflects at a much flatter angle than the reflector face 5 with respect to the collimator sectional plane 4. This means that only some of the light reflected by it strikes the opposite reflector face 5 and is reflected again on the latter. The rest of the light reflected by the lower section 6 therefore passes to the emission face 10 without further reflections. On account of the geometry of the section 6, the light impinges in a region in the emission face 10 close to the first edge 8. Since the upper section 7 is inclined even more than the lower section 6, no radiation from the LED element 2 strikes the upper section 7 directly. It also does not assist in reflecting rays which have already been reflected once on the reflector face 5. It therefore does not need to have a highly reflective surface, and it may in principle even be omitted.

In the above-described design, a large amount of the radiation emitted by the LED element 2 consequently impinges on the emission face 10 close to the first edge 8, so that the light intensity distribution of the radiation has a course with a decreasing gradient from the first edge 8 to the second edge 9. On the side of the edge 8 facing away from the LED, only a very small amount of scattered radiation strikes behind the emission face 10, and it can be ensured, by suitably selecting and/or connecting the secondary optics, that this scattered radiation is not projected into the traffic space above the cut-off.

Figure 3:
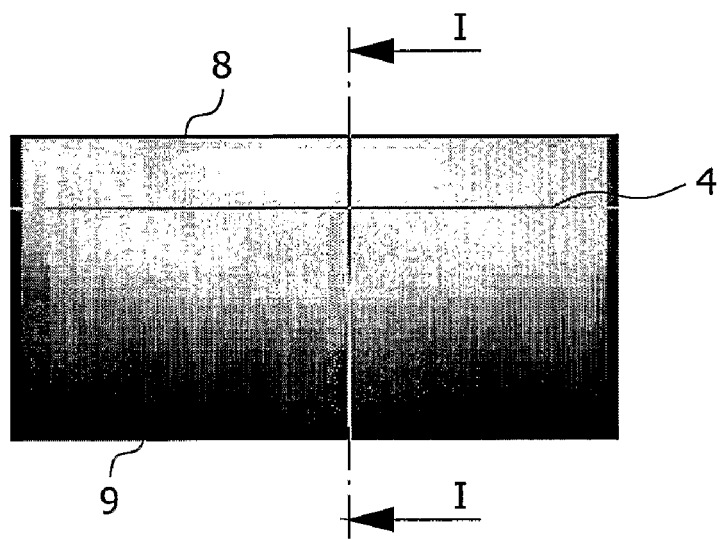
FIG. 3 shows a lighting image in the emission plane of an LED collimator element.

An image as shown in FIG. 3 is therefore obtained. There is a decreasing light intensity from the upper edge 8 towards the lower edge 9 along any section parallel to the section line I-I. Since no light is emitted above the first edge 8, a sharp cut-off is produced along the first edge 8. Said two necessary properties of a lighting system in particular for motor vehicle headlights are therefore obtained, namely on the one hand a sharp cut-off directly at the region of the highest light intensity and on the other hand a defined gradient in the light intensity distribution from a high intensity at the cut-off to a low intensity at a region lying opposite the cut-off.

Figure 4:
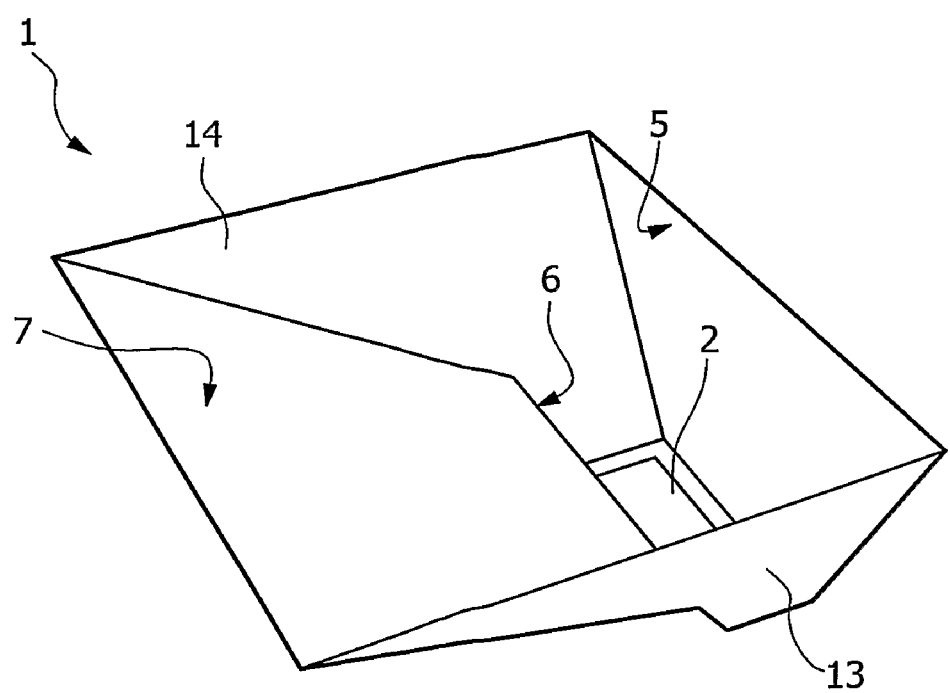
FIG. 4 shows a perspective view of an LED collimator element as shown in FIG. 2.

FIG. 4 shows a perspective view of an LED collimator element according to the invention as shown in FIG. 2. This view shows above all the association of the reflective faces 5, 6, 7 and 13 and 14 with respect to one another and with respect to the LED element 2. Parallel to the plane of the drawing in FIG. 2, the LED collimator element 1 is delimited by lateral reflector faces 13 and 14. They are inclined outwards when seen in the emission direction, but may also run at right angles to the plane of the LED element 2 and thus parallel to the collimator sectional plane 4 as shown in FIG. 2.

Figure 8:
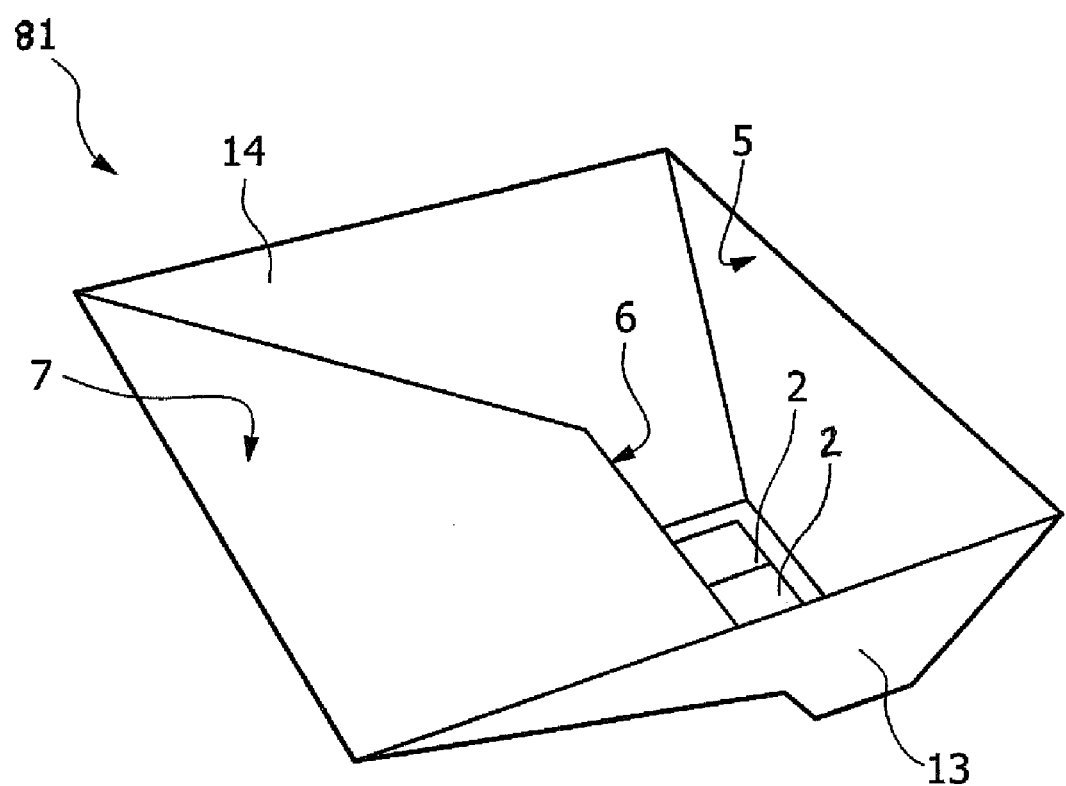
FIG. 8 shows a perspective view of an LED collimator element that has a plurality of LEDs.

The LED element 2 has a rectangular base, the longitudinal side of which extends transversely to the emission direction in the direction of the reflector face 5 and thus parallel to the collimator sectional plane 4 of FIG. 2. Instead of one LED element 2 having a rectangular base, a number of square LED elements for example could also be arranged next to one another so that they cover the same area as shown in device 81 in FIG. 8.

Figure 5:
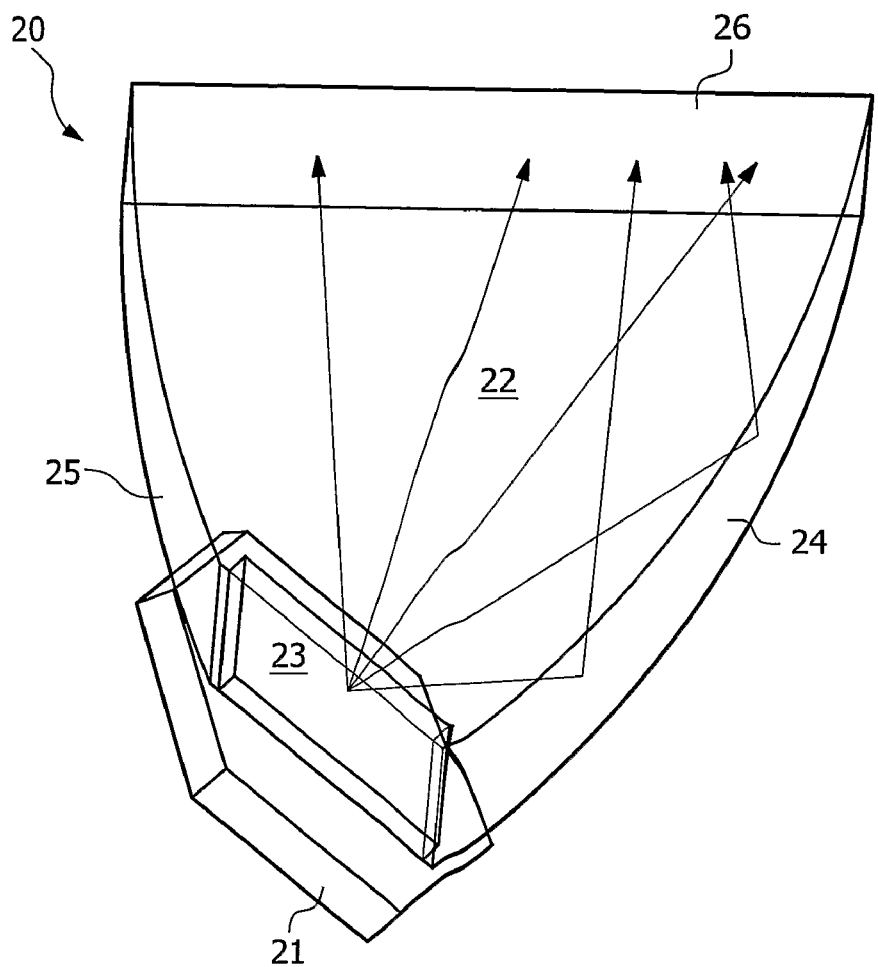
FIG. 5 shows an LED collimator element according to the invention, according to a second example of embodiment.

FIG. 5 shows by way of example an LED collimator element 20 according to another example of embodiment according to the invention. An LED element 23 is positioned on a support 21 which is installed in a tilted manner on a collimator 22, said LED element emitting light into the collimator 22. The collimator 22 comprises a long side 24 and a short side 25 and has an emission opening 26 opposite the LED element 23. On account of the inclined position of the support 21 and of the LED element 23 with respect to the emission opening 26, the LED element emits light mainly onto the long side 24 of the collimator 22. The inclination of the LED element 23 is selected such that the light is mainly reflected only once, if at all. In this way, there is produced at the emission opening 26 a light distribution in which a large amount of light is emitted at the long side 24 and a smaller amount of light is emitted at the short side 25. This LED collimator element 20 therefore also has said desired gradient with regard to the light distribution at its emission opening 26, said gradient being desirable for applications for example in motor vehicle headlights.

Figure 6:
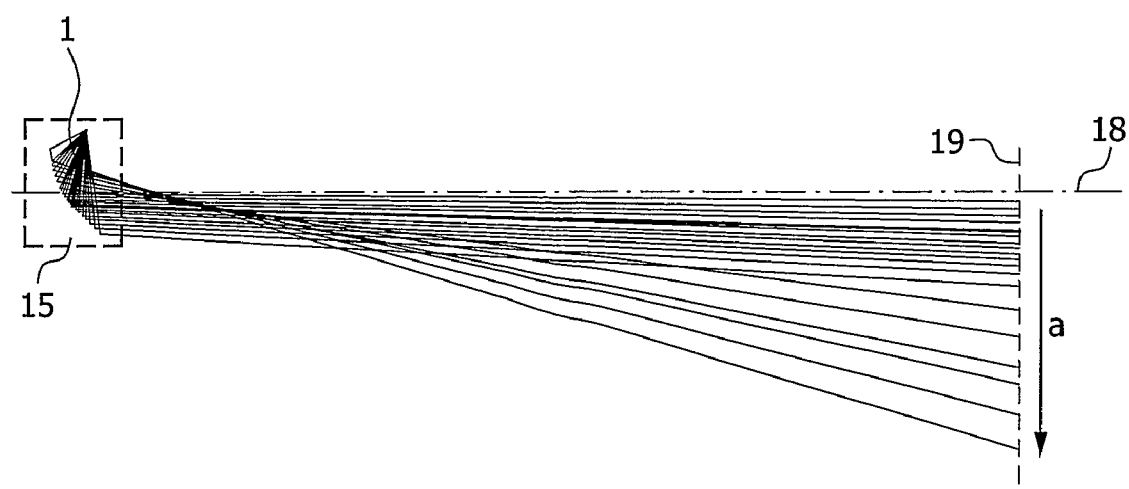
FIG. 6 shows an overall view of an LED collimator element in conjunction with a parabolic reflector and the associated ray course.
Figure 7:
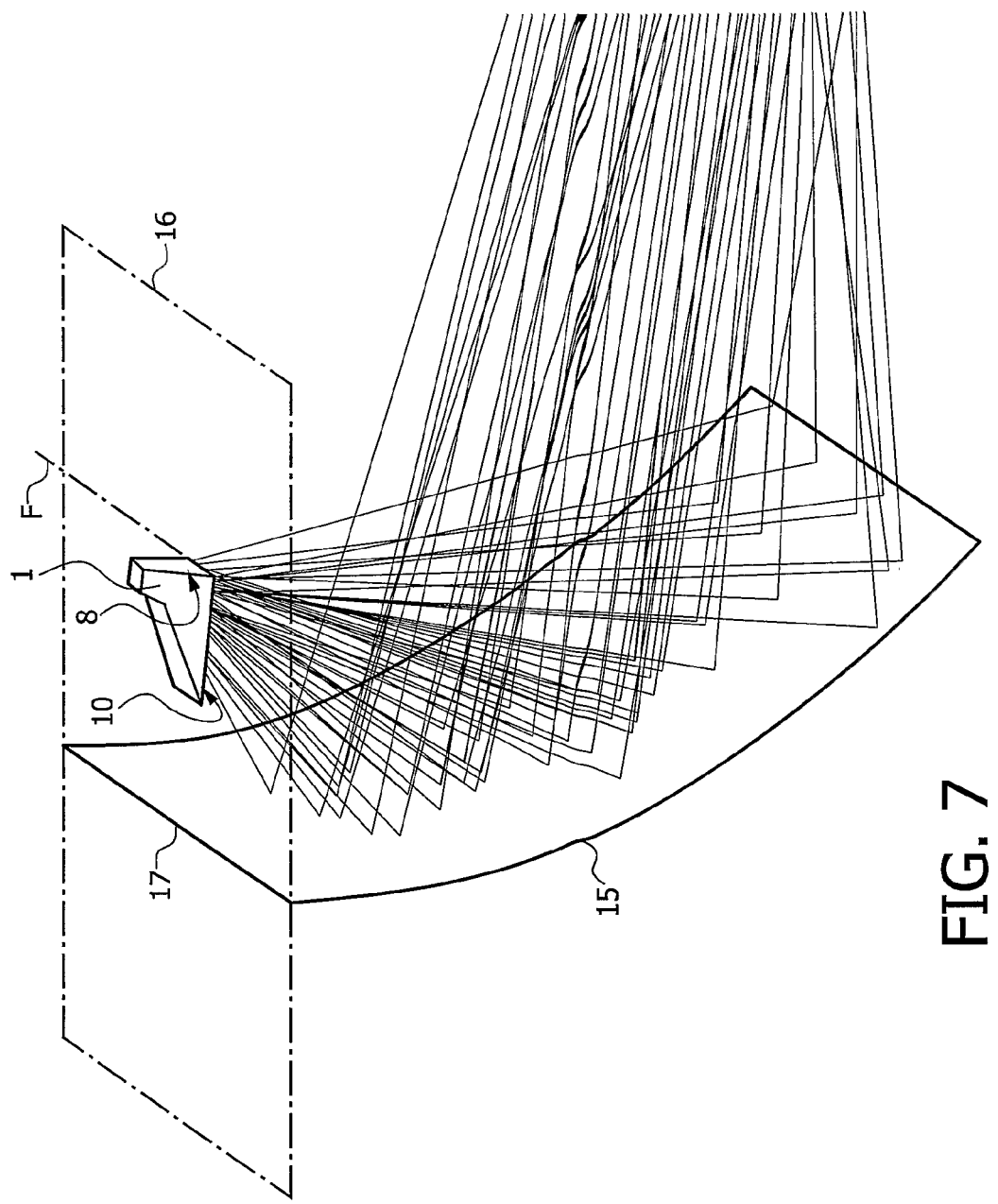
FIG. 7 shows a detailed view of part of the diagram of FIG. 6.

FIGS. 6 and 7 show the cooperation of the asymmetrical collimator 1 with a two-dimensional semiparabolic reflector 15.

FIG. 7 shows a detail of FIG. 6. The asymmetrical collimator 1 is arranged with its emission face 10 in an irradiated plane 16 of the semiparabolic reflector 15 in such a way that it extends from a focal line F in the direction of a rear edge 17 of the semiparabolic reflector 15. The LED collimator element 1 is moreover oriented in such a way that its front edge 8, on which a maximum of light radiation is present, coincides with the focal line F.

This assignment of the LED collimator element 1 with respect to the semiparabolic reflector 15 has the effect that all of the light coming from the LED collimator element 1 and deflected by the parabolic reflector 15 is emitted below an emission direction 18 of the semiparabolic reflector 15. Since light is introduced exclusively between the focal point F and the first edge 17 of the semiparabolic reflector 15, no radiation is emitted above a plane which extends at right angles to the plane of the drawing in FIG. 7 and in the emission direction 18. On an image face 19, which is selected by way of example to be at right angles to the emission direction 18, a sharp cut-off is thus formed at the intersection between said image face and the emission direction 18. Moreover, the above-described lighting gradient which is present at the emission face 10 of the LED collimator element 1 is likewise transmitted into the image face 19, so that there is a decreasing lighting intensity in the direction of the arrow a.

Finally, it should once again be pointed out that the systems and methods shown in the figures and the description are merely examples of embodiments which can be widely varied by the person skilled in the art without departing from the scope of the invention. Moreover, for the sake of clarity, it should be pointed out that the use of the indefinite article "a" or "an" does not prevent it from being possible for the relevant features to be present more than once.

The invention claimed is:

1. A device, comprising:
   an LED which during operation emits a first portion of light directly into an emission angle region of the device; and
   a collimator which deflects into the emission angle region of the device a second portion of the light of the LED which is not emitted by the LED directly into the emission angle region of the device, the collimator having a first face and a second face opposite the first face;
   wherein the device is asymmetrical at least with respect to a collimator sectional plane so that a defined non-uniform light intensity distribution is achieved in an emission plane of the device which is orthogonal to the collimator sectional plane and to a main emission direction of the device, and
   wherein the light intensity distribution in the emission plane decreases as a distance from the first face increases.

2. The device of claim 1, wherein the non-uniform light intensity distribution has a maximum intensity directly at a first edge of the first face of the collimator and wherein essentially no light intensity is present on an outside of the first edge of the first face of the collimator which faces away from the LED.

3. The device of claim 1, wherein the LED is tilted at an angle with respect to the sectional plane of the collimator.

4. The device of claim 1, wherein the opposing first and second faces of the collimator have different angles with respect to the sectional plane of the collimator.

5. The device of claim 1, the first face of the collimator is less inclined than the second face of the collimator with respect to the main emission direction.

6. The device of claim 1, wherein the first face is parallel to the main emission direction.

7. The device of claim 6, wherein a distance of the first face of the collimator from the LED is less than or equal to 0.5 mm.

8. The device of claim 1, further comprising an optical device arranged behind an opening of the collimator in the main emission direction, the optical device being configured to project the emitted light into a space which is to be illuminated.

9. The device of claim 8, wherein the optical device comprises a semiparabolic reflector.

10. The device of claim 1, further comprising at least one additional LED, the LEDs being arranged parallel to the collimator sectional plane.

11. The device of claim 10, wherein at least two of the LEDs emit light with different colors than each other.

12. A collimator for the device of claim 1, wherein the collimator is asymmetrical with respect to the main emission direction of the device.

13. The collimator of claim 12, wherein the collimator has a seating for the LED in order to accommodate the LED in an inclined manner with respect to the main emission direction of the device.

14. The device of claim 1, wherein the first portion of the light is greater than the second portion of the light.

15. The device of claim 1, wherein the distance of the first face of the collimator from the LED is less than or equal to 0.25 mm.

16. An illumination device, comprising:
   an LED which has a principle emission surface and which is configured to emit light; and
   a collimator which has an emission face from which the light from the LED is emitted;
   wherein the LED emits a first portion of the light directly to the emission face of the collimator,
   wherein the collimator deflects to the emission face thereof a second portion of the light of the LED, which second portion is not emitted by the LED directly to the emission face of the illumination device, and
   wherein the collimator is asymmetrical at least with respect to a collimator sectional plane that is perpendicular to the principle emission surface of the LED so that a defined non-uniform light intensity distribution is achieved at the emission face of the collimator, and
   wherein the first portion of the light is greater than the second portion of the light at the emission face of the collimator.

17. The illumination device of claim 16, wherein an emission plane of the collimator is substantially parallel to the principle emission surface of the LED, and wherein the collimator has a first surface substantially perpendicular to the emission plane and substantially perpendicular to the principle emission surface of the LED, and has a second surface opposite the first surface and not parallel to the first surface.

18. The illumination device of claim 17, wherein the light intensity in the emission plane increases with increasing distance from the first surface.

19. The illumination device of claim 17, wherein a distance from the LED to the first surface is less than or equal to 0.5 mm.

20. The illumination device of claim 16, further comprising a semiparabolic reflector adapted to receive the light from the emission face of the collimator.

* * * * *